United States Patent
Shen et al.

(10) Patent No.: US 10,274,365 B2
(45) Date of Patent: Apr. 30, 2019

(54) OPTICAL MODULE PACKAGE STRUCTURE AND METHOD THEREOF

(71) Applicant: PIXART IMAGING INC., Hsin-Chu (TW)

(72) Inventors: Chi-Chih Shen, Hsin-Chu (TW); Kuo-Hsiung Li, Hsin-Chu (TW); Shang-Feng Hsieh, Hsin-Chu (TW); Jui-Cheng Chuang, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 87 days.

(21) Appl. No.: 15/479,048

(22) Filed: Apr. 4, 2017

(65) Prior Publication Data
US 2018/0087958 A1 Mar. 29, 2018

(30) Foreign Application Priority Data
Sep. 23, 2016 (TW) .............................. 105130819 A

(51) Int. Cl.
| | |
|---|---|
| *G01J 1/02* | (2006.01) |
| *G01D 5/34* | (2006.01) |
| *G01D 5/347* | (2006.01) |
| *G01D 11/24* | (2006.01) |
| *H01L 27/146* | (2006.01) |

(52) U.S. Cl.
CPC ........ *G01J 1/0271* (2013.01); *G01D 5/34707* (2013.01); *G01D 11/245* (2013.01); *G01J 1/0204* (2013.01); *G01J 1/0214* (2013.01); *H01L 27/14618* (2013.01)

(58) Field of Classification Search
CPC ...... G01J 1/0271; G01J 1/0204; G01J 1/0214; G01J 1/02; G01J 1/0209; G01J 2001/0276; G01D 5/34707; G01D 11/245; G01D 11/26; G01D 11/24; H01L 27/14601; H01L 27/146; H01L 27/14618
See application file for complete search history.

(56) References Cited

U.S. PATENT DOCUMENTS

| | | | | |
|---|---|---|---|---|
| 9,291,457 | B2 * | 3/2016 | Aoki | H05K 5/066 |
| 9,911,877 | B2 * | 3/2018 | Ho | H01L 31/02327 |
| 9,976,894 | B2 * | 5/2018 | Yu | G01J 1/0209 |
| 9,999,165 | B2 * | 6/2018 | Cho | H05K 9/0026 |
| 2003/0098912 | A1 * | 5/2003 | Hosokai | H01L 27/14618 |
| | | | | 348/207.99 |
| 2008/0251722 | A1 * | 10/2008 | Hayashi | G01J 1/02 |
| | | | | 250/338.1 |

(Continued)

*Primary Examiner* — John R Lee
(74) *Attorney, Agent, or Firm* — Li & Cai Intellectual Property (USA) Office

(57) ABSTRACT

The present disclosure discloses an optical module package structure and method thereof. The optical module includes a substrate, a shield, a photosensitive unit and a cover. The shield is disposed on the top of the substrate and forms a first housing space with the upper surface of the substrate. The photosensitive unit is disposed on the substrate and located in the first housing space. The shield has a light-receiving part above the photosensitive unit. At least one notch is on the outer surface of the shield. A cushion is disposed on the notch and protrudes on the upper surface of the shield. The cover is disposed on the cushion(s) and kept a constant distance to the upper surface of the shield by contacting with the cushion(s).

14 Claims, 5 Drawing Sheets

(56) References Cited

U.S. PATENT DOCUMENTS

| | | | |
|---|---|---|---|
| 2010/0196642 A1* | 8/2010 | Langer | B23P 11/00 |
| | | | 428/36.8 |
| 2015/0200221 A1* | 7/2015 | Heimgartner | H01L 31/02325 |
| | | | 257/432 |
| 2016/0091364 A1* | 3/2016 | Tu | G01J 1/0271 |
| | | | 250/216 |
| 2017/0115159 A1* | 4/2017 | Shen | G01J 1/0214 |
| 2018/0087958 A1* | 3/2018 | Shen | G01J 1/0271 |

* cited by examiner

OPTICAL MODULE PACKAGE STRUCTURE AND METHOD THEREOF

BACKGROUND OF THE INVENTION

1. Field of the Invention

The present disclosure relates to a package structure and method thereof; in particular, to a package structure and method thereof for an optical module.

2. Description of Related Art

Currently, the optical proximity sensor has become the major choice of electronic devices for distance sensing. For example, when an electronic device is close to the face of a user or placed in a pocket, the optical proximity sensor can detect an object close by, and the electronic device can immediately turn off the display and/or the touch function to avoid inadvertent touch and save power consumption, thereby providing a better user experience.

The light source of the optical proximity sensor emits light, and the light is reflected by the object to a sensor of the optical proximity sensor, and then converted into electronic signals for processing to achieve the purpose of detecting objects. The light source and the sensor of the optical proximity sensor must be separated from each other by a shield, so that the light source and the sensor can be disposed on the same substrate, to avoid interference with each other and reducing the product performance.

However, the optical proximity sensor should be covered with a cover when assembled with the electronic device, and since the cover cannot always fit perfectly against the optical proximity sensor, an air gap between the cover and the shield of the optical proximity sensor is often formed. Thus, the distance between the cover and the shield is often inconsistent, resulting in measurement errors of the optical proximity sensor.

SUMMARY OF THE INVENTION

In order to solve the above-mentioned problems, the present disclosure provides an optical module package structure and a method thereof which disposes a cushion on the notch of the shield to keep a constant distance between the cover and the shield.

In order to achieve the aforementioned objects, according to an embodiment of the present disclosure, an optical module package structure includes: a substrate; a photosensitive unit disposed on the substrate; and a shield disposed on the top of the substrate and forming a first housing space with the upper surface of the substrate. The photosensitive unit is located in the first housing space, wherein the shield has a light-receiving part above the photosensitive unit. The outer surface of the shield has at least one notch, and a cushion is disposed on the notch. The cushion protrudes on the upper surface of the shield. A cover is disposed on the cushion(s) and kept a constant distance to the upper surface of the shield by contacting with the cushion(s).

In order to achieve the aforementioned objects, according to another embodiment of the present disclosure, an optical module package method includes: setting a photosensitive unit on a substrate; setting a shield on the top of the substrate, wherein the shield forms a first housing space with the upper surface of the substrate, and the photosensitive unit is located in the first housing space, the shield having a light-receiving part above the photosensitive unit, and the outer surface of the shield having at least one notch; setting a cushion on the notch, wherein the cushion protrudes on the upper surface of the shield; and setting a cover on the cushion(s), wherein the cover keeps a constant distance to the upper surface of the shield by contacting with the cushion(s).

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
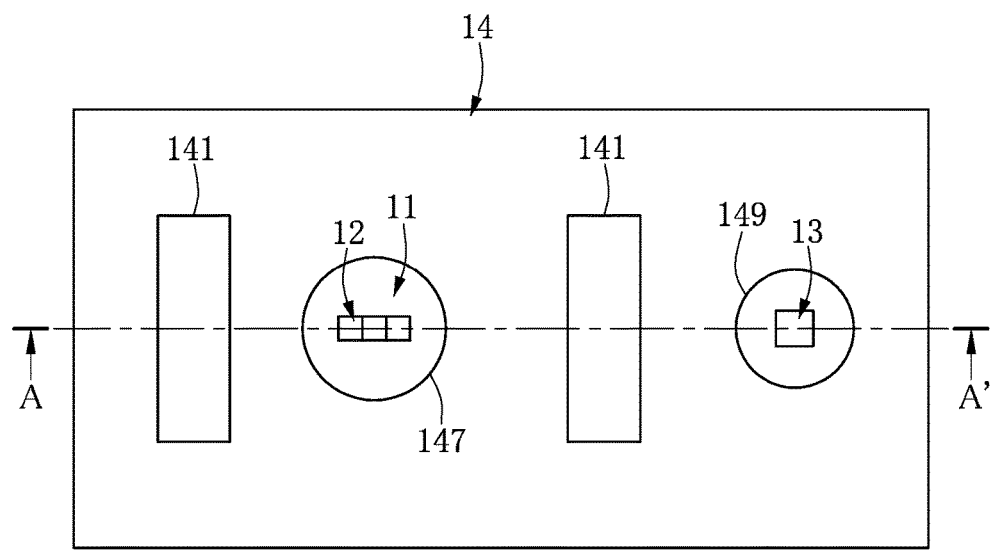
FIG. 1 shows a top view of an optical module package structure according to one embodiment of the present disclosure.
Figure 2:
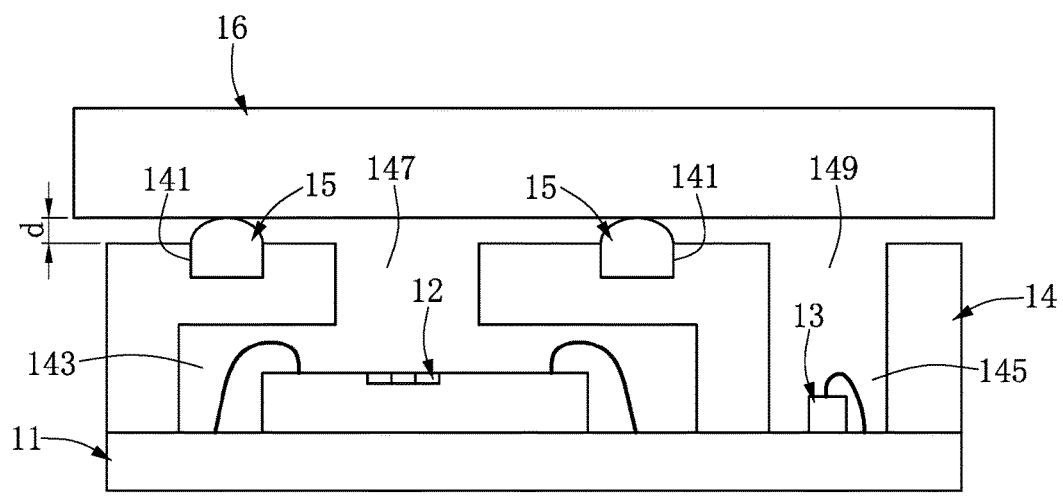
FIG. 2 shows a sectional view of an optical module package structure according to one embodiment of the present disclosure.

Referring to FIGS. 1 and 2, in which FIG. 2 is a cross-sectional view along line A-A' of FIG. 1, the optical module package structure 10 includes a substrate 11, a photosensitive unit 12, a light source 13, a shield 14, cushions 15 and a cover 16. The shield 14 has a light-receiving part 147, a light-emitting part 149 and notches 141. The cushions 15 and the cover 16 are not shown in FIG. 1 for ease of illustration.

The substrate 11, for example, could be a printed circuit board (PCB), to which the present disclosure is not limited. The photosensitive unit 12, for example, could be a charge-coupled device (CCD) and/or a complementary metal-oxide-semiconductor (CMOS). The photosensitive unit 12 is disposed on the substrate 11 and connected to the substrate 11 by a bonding wire. The shield 14 is made of a lightproof material. The shield 14 is disposed on the substrate 11 and forms a first housing space 143 and a second housing space 145 with the upper surface of the substrate 11, and the photosensitive unit 12 is located in the first housing space 143. The shield 14 has a light-receiving part 147 above the photosensitive unit 12, in which the light-receiving part 147 is an opening of the shield 14 to allow the photosensitive unit 12 to receive light from outside the first housing space 143.

The light source 13, for example, could be a light-emitting diode (LED) and/or a laser diode. The light source 13 is disposed on the substrate 11 and connected to the substrate 11 by the bonding wire. The light source 13 is located in the second housing space 145. The shield 14 has a light-emitting part 149 above the light source 13, in which the light-emitting part 149 is an opening of the shield 14 to allow the light generated by the light source 13 to emit to the outside of the second housing space 145.

Since the shield 14 is made of a lightproof material, the optical module package structure 10 can only transmit the light generated by the light source 13 through the light-emitting part 149, and the photosensitive unit 12 can only receive light from outside the first housing space 143 through the light-receiving part 147, so that the light source 13 and the photosensitive unit 12 can be separated from each other by the shield 14 to avoid performance reduction.

In this embodiment, the shield 24 has two notches 141 on the top surface thereof. The two notches 141 are symmetrically distributed around the light-receiving part 147, in which two cushions 15 are disposed on two notches 141 respectively. The cushions 15 protrude on the upper surface of the shield 14.

In this embodiment, the width of the notch 141 of the shield 14 is between 0.3~3.0 mm, to which the present disclosure is not limited.

In this embodiment, the depth of the notch 141 of the shield 14 is between 0.1~1.0 mm, to which the present disclosure is not limited.

In this embodiment, the height of the cushion 15 protruding from the upper surface of the shield 14 is between 0.1~1.0 mm, to which the present disclosure is not limited.

The cushion 15 is made of an elastic material. The cushion 15, for example, could be made of foam and/or silicone, to which the present disclosure is not limited.

The cover 16 is disposed on two cushions 15. Since the cushion 15 is made of an elastic material, the cover 16 can keep a constant distance d to the upper surface of the shield 14 by contacting with cushions 15. Accordingly, the present embodiment achieves the purpose of keeping a constant distance between the cover 16 and the shield 14 and solving the measurement error problem from inconsistent spacing of the cover 16 and the shield 14 of the prior art. Moreover, the cushion 15 can avoid the pressing or impacting of the elements of the optical module package structure 10 when the cover 16 is assembled. It prevents damage or deformation caused by pressing the shield 14 or prevents damage to the elements and the bonding wire.

The notch 141 of the shield 14 allows the cushion 15 to be easily and stably disposed on the shield 14 at a specific position. When the cushion 15 is made of an originally fluid material such as silicone, the notch 141 provides the space required for the cushion 15 to flow, so that the cushion 15 can be accurately disposed at the specific position on the shield 14.

In another embodiment, the cushion 15 is made of a heat-resistant material such as silicone. The cushion 15 can withstand the high temperature (about 260° C.) required for the SMT (Surface Mount Technology) process, so that the cushion 15 can be disposed at the initial manufacture stage of the optical module package structure 10.

In another embodiment, the cushion 15 is made of a non-heat-resistant material such as foam, so that the cushion 15 should be disposed at the final assembly stage of the product (a phone or a tablet PC) assembled with the optical module package structure 10. The cushion 15, for example, can be attached to the shield 14 by a double-sided tape or an adhesive.

Therefore, the cushion 15 being disposed in the notch 141 of the shield 14 helps in the final assembly of the product assembled with the optical module package structure 10 and makes the assembly process easy and precise.

Figure 3A:
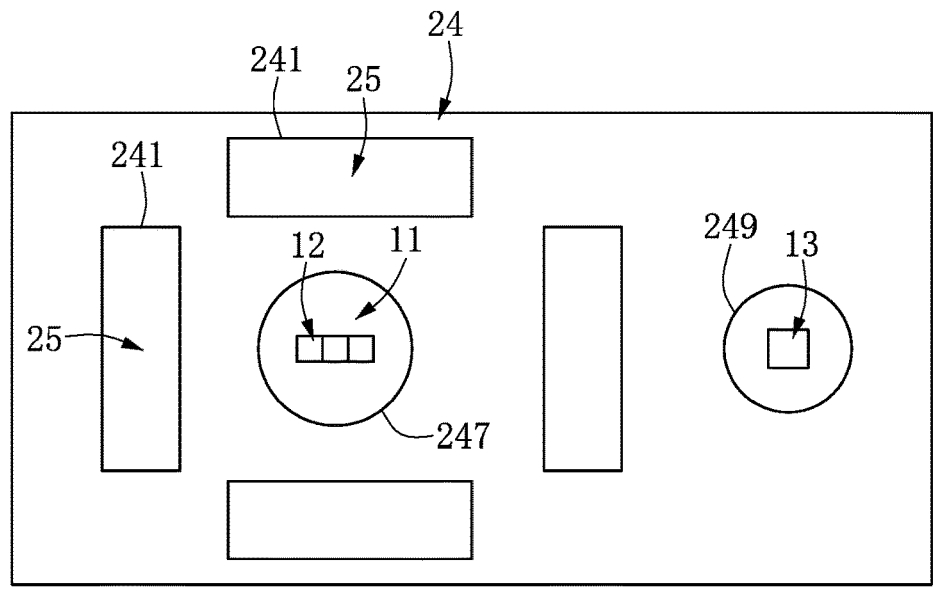
FIG. 3A shows a top view of an optical module package structure according to another embodiment of the present disclosure.

Referring to FIG. 3A, the optical module package structure 20 according to another embodiment of the present disclosure includes a substrate 11, a photosensitive unit 12, a light source 13, a shield 24, cushions 25 and a cover (not shown). The shield 24 has a light-receiving part 247, a light-emitting part 249 and notches 241.

The present embodiment is different from the embodiment in FIG. 1 and FIG. 2 in that the shield 24 of the present embodiment has four notches 241 on the top surface thereof. The four notches 241 are symmetrically distributed around the light-receiving part 247, in which four cushions 25 are disposed on the four notches 241 respectively. Accordingly, when the cover is disposed on the four cushions 25, the cover can keep a constant distance to the upper surface of the shield 24 by contacting with the cushions 25 to achieve the purpose of keeping a constant distance between the cover and the top surface of the shield 24.

In this embodiment, the four cushions 25 are symmetrically distributed around the light-receiving part 247, so that the contact force between the cover and the cushions 25 can be more uniform and the distance between the cover and the shield 24 can be more identical.

Figure 3B:
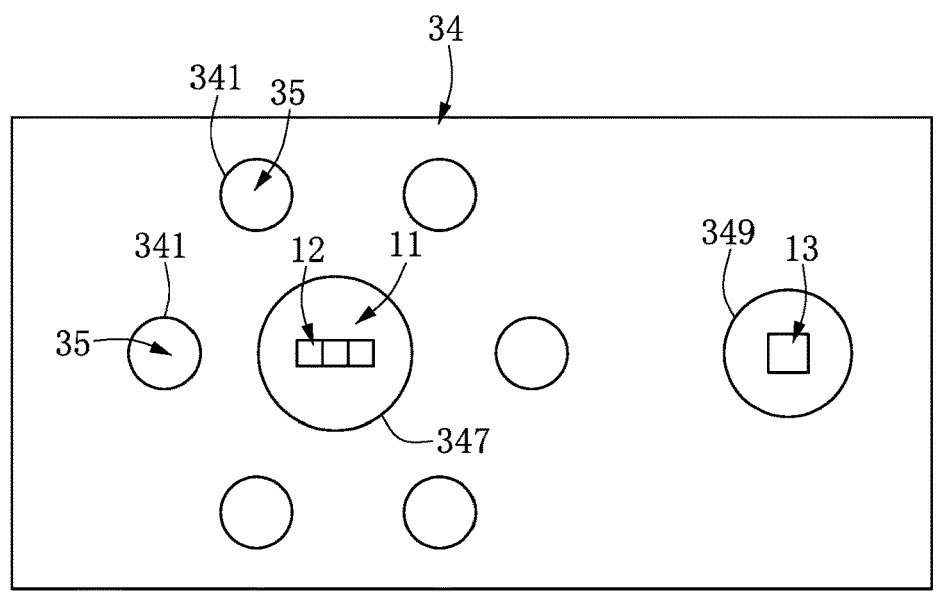
FIG. 3B shows a top view of an optical module package structure according to still another embodiment of the present disclosure.

Referring to FIG. 3B, the optical module package structure 30 according to still another embodiment of the present disclosure includes a substrate 11, a photosensitive unit 12, a light source 13, a shield 34, cushions 35 and a cover (not shown). The shield 34 has a light-receiving part 347, a light-emitting part 349 and notches 341.

The present embodiment is different from the embodiment in FIG. 1 and FIG. 2 in that the shield 34 of the present embodiment has six notches 341 on the top surface thereof. The six notches 341 are symmetrically distributed around the light-receiving part 347, in which six cushions 35 are disposed on six notches 341 respectively. Accordingly, when the cover is disposed on the six cushions 35, the cover can keep a constant distance to the upper surface of the shield 34 by contacting with the cushions 35 to achieve the purpose of keeping a constant distance between the cover and the top surface of the shield 34.

In this embodiment, the six cushions 35 are symmetrically distributed around the light-receiving part 347, so that the contact force between the cover and cushions 35 can be more uniform and the distance between the cover and the shield 34 can be more identical.

Figure 3C:
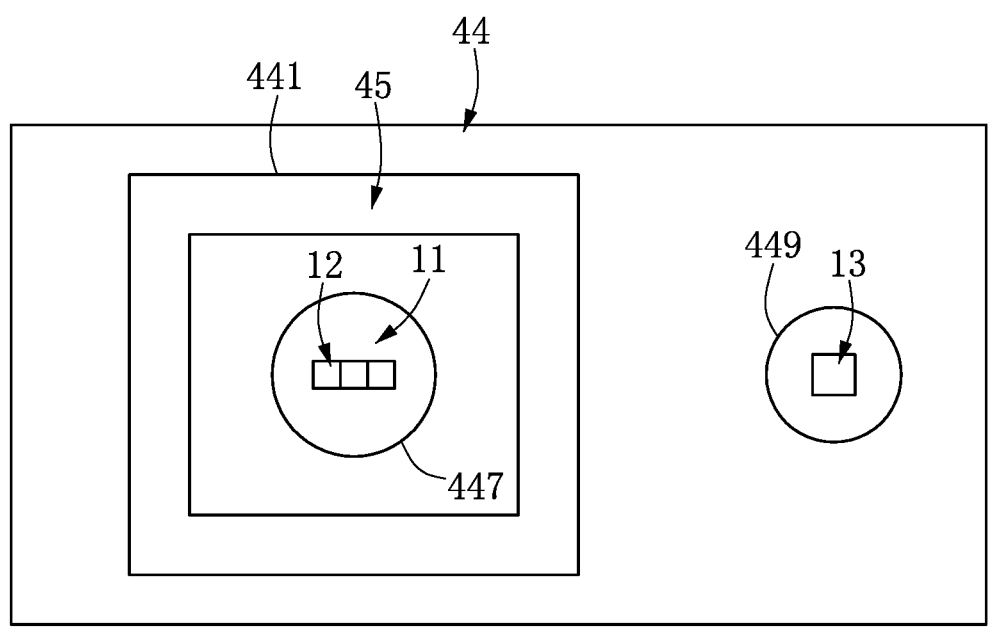
FIG. 3C shows a top view of an optical module package structure according to still another embodiment of the present disclosure.

Referring to FIG. 3C, the optical module package structure 40 according to still another embodiment of the present disclosure includes a substrate 11, a photosensitive unit 12, a light source 13, a shield 44, a cushion 45 and a cover (not shown). The shield 44 has a light-receiving part 447, a light-emitting part 449 and a notch 441.

The present embodiment is different from the embodiment in FIG. 1 and FIG. 2 in that the notch 441 of the shield 44 of the present embodiment is a ring-shaped notch structure. The notch 441 is symmetrically distributed around the light-receiving part 447, in which the cushion 45 is disposed on the notch 441. Accordingly, when the cover is disposed on the cushion 45, the cover can keep a constant distance to the upper surface of the shield 44 by contacting with the cushions 45 to achieve the purpose of keeping a constant distance between the cover and the top surface of the shield 44.

In this embodiment, cushion 45 is symmetrically distributed around the light-receiving part 447, so that the contact force between the cover and cushions 45 can be more uniform and the distance between the cover and the shield 44 can be more identical.

Figure 4A:
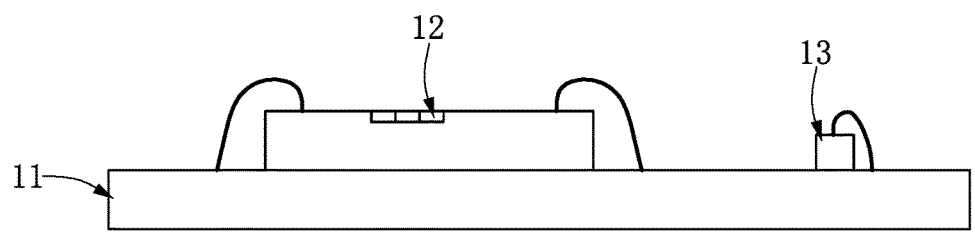
FIGS. 4A-4D show a flowchart of an optical module package structure according to one embodiment of the present disclosure.
Figure 4B:
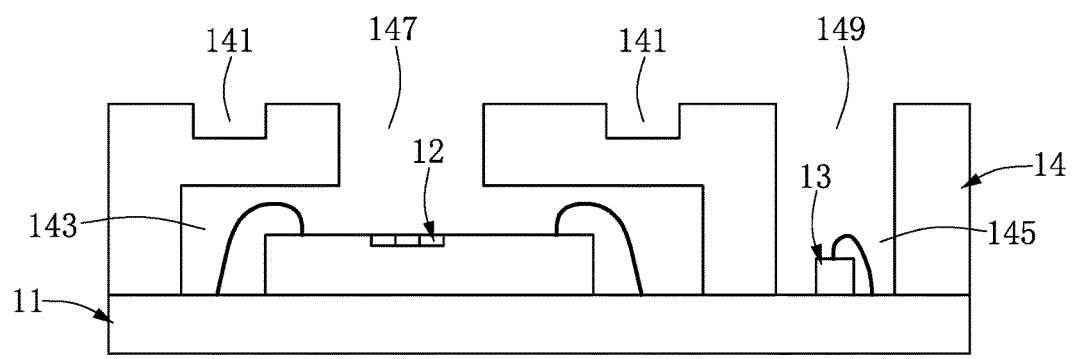

Reference is next made to FIG. 1, FIG. 2 and FIGS. 4A-4D. In FIG. 4A, a photosensitive unit 12 and a light source 13 are disposed on a substrate 11. In FIG. 4B, a shield 14 is disposed on the substrate 11 and forms a first housing space 143 and a second housing space 145 with the upper surface of the substrate 11. The photosensitive unit 12 is located in the first housing space 143 and the light source 13 is located in the second housing space 145. The shield 14 has a light-receiving part 147 above the photosensitive unit 12, in which the light-receiving part 147 is an opening of the shield 14 to allow the photosensitive unit 12 to receive light from outside the first housing space 143. The shield 14 has a light-emitting part 149 above the light source 13, wherein the light-emitting part 149 is an opening of the shield 14 to allow the light generated by the light source 13 to emit to the outside of the second housing space 145. The shield 14 has notches 141 on the top surface thereof.

Figure 4C:
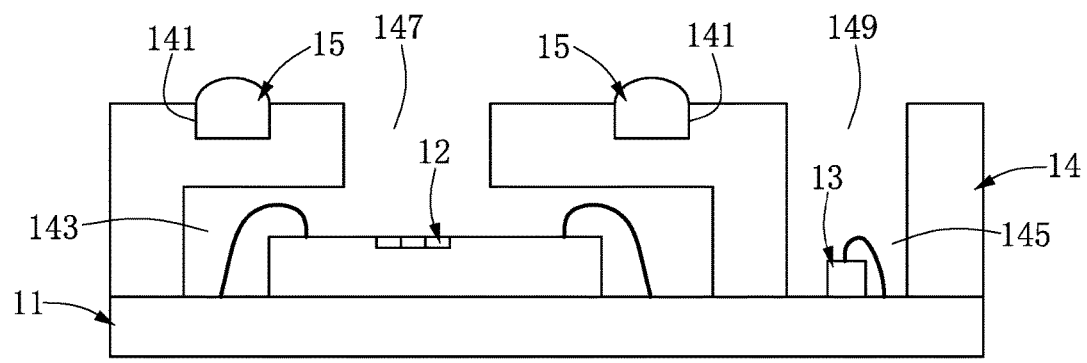
Figure 4D:
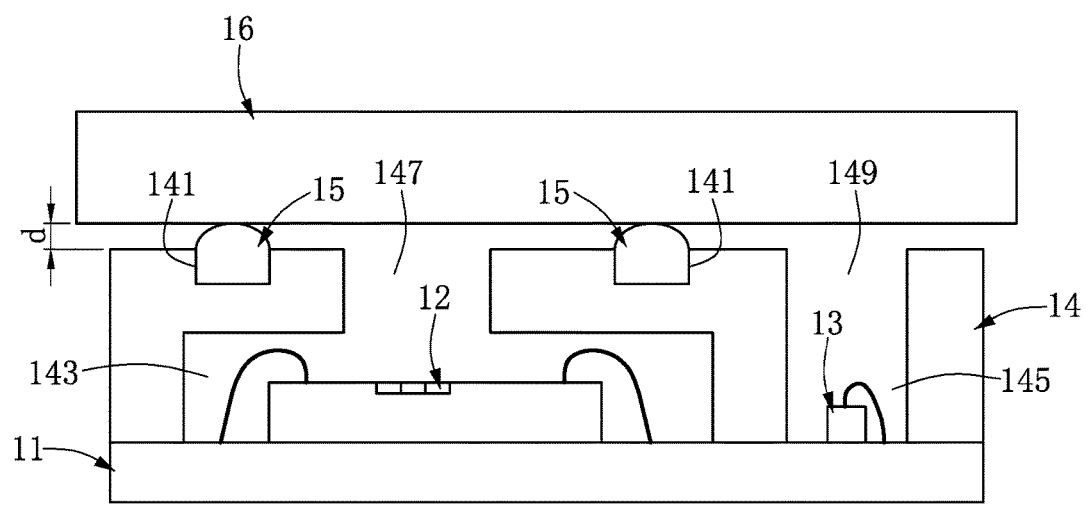

In FIG. 4C, the cushion 15 is disposed on each of the notches 141, and the cushion 15 partially protrudes from the upper surface of the shield 14. In FIG. 4D, the cover 16 is disposed on cushions 15, and the cover 16 keeps a constant distance d to the upper surface of the shield 14 by contacting with the cushions 15. Accordingly, the present embodiment achieves the purpose of keeping a constant distance between the cover 16 and the shield 14 and solving the measurement error problem from inconsistent spacing of the cover 16 and the shield 14 of the prior art.

In summary, an optical module package structure and a method thereof according to the present disclosure disposes the cushion on the notch of the shield to achieve the purpose of keeping a constant distance between the cover and the shield and solve the measurement error problem from inconsistent spacing of the cover and the shield of the prior art. The present disclosure can help in the final assembly of the product assembled with the optical module package structure and makes the assembly process easy and precise.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An optical module package structure, comprising:
   a substrate;
   a photosensitive unit, disposed on the substrate;
   a shield disposed on an upper surface of the substrate, forming a first housing space with the upper surface of the substrate, the photosensitive unit being located in the first housing space, wherein the shield has a light-receiving part above the photosensitive unit, an outer surface of the shield having at least one notch, a cushion disposed partly within the notch so as to protrude from the upper surface of the shield; and
   a cover disposed on the cushion and keeping a constant distance to the upper surface of the shield by contacting with the cushion.

2. The optical module package structure according to claim 1, wherein the at least one notch is symmetrically distributed around the light-receiving part.

3. The optical module package structure according to claim 1, wherein the light-receiving part is an opening allowing the photosensitive unit to receive light from outside the first housing space.

4. The optical module package structure according to claim 1, further comprising a light source disposed on the substrate, wherein the shield forms a second housing space with the upper surface of the substrate, and the light source is located in the second housing space;
   wherein the shield has a light-emitting part above the light source, and the light-emitting part is an opening allowing the light generated by the light source to emit to the outside of the second housing space.

5. The optical module package structure according to claim 1, wherein the cushion is made of a non-heat-resistant material.

6. The optical module package structure according to claim 1, wherein the cushion is made of a heat-resistant material.

7. The optical module package structure according to claim 1, wherein the shield is made of a lightproof material.

8. The optical module package structure according to claim 1, wherein the substrate is a printed circuit board (PCB).

9. An optical module package method, comprising:
   setting a photosensitive unit on a substrate;
   setting a shield on an upper surface of the substrate, the shield forming a first housing space with the upper surface of the substrate, the photosensitive unit being located in the first housing space, wherein the shield has a light-receiving part above the photosensitive unit, and an outer surface of the shield has at least one notch;
   setting a cushion disposed partly within the notch so as to protrude from the upper surface of the shield; and
   setting a cover on the cushion, wherein the cover keeps a constant distance to the upper surface of the shield by contacting with the cushion.

10. The optical module package method according to claim 9, wherein the at least one notch is symmetrically distributed around the light-receiving part.

11. The optical module package method according to claim 9, wherein the light-receiving part is an opening allowing the photosensitive unit to receive light from outside the first housing space.

12. The optical module package method according to claim 9, wherein the shield forms a second housing space with the upper surface of the substrate, and the method further comprises:
   setting a light source on the substrate, the light source being located in the second housing space, wherein the shield has a light-emitting part above the light source, and the light-emitting part is an opening allowing the light generated by the light source to emit to the outside of the second housing space.

13. The optical module package structure according to claim 5, wherein the non-heat-resistant material comprises foam.

14. The optical module package structure according to claim 6, wherein the heat-resistant material comprises silicone.

* * * * *